(12) United States Patent
Han

(10) Patent No.: US 11,705,587 B2
(45) Date of Patent: Jul. 18, 2023

(54) TERMINAL CASE HAVING THE IMPROVED FUNCTION OF ESTIMATING STATE OF SECONDARY BATTERY

(71) Applicant: LG Chem, Ltd., Seoul (KR)

(72) Inventor: Song-Yi Han, Daejeon (KR)

(73) Assignee: LG Energy Solution, Ltd.

( * ) Notice: Subject to any disclaimer, the term of this patent is extended or adjusted under 35 U.S.C. 154(b) by 557 days.

(21) Appl. No.: 16/628,578

(22) PCT Filed: Feb. 13, 2019

(86) PCT No.: PCT/KR2019/001771
§ 371 (c)(1),
(2) Date: Jan. 3, 2020

(87) PCT Pub. No.: WO2019/160333
PCT Pub. Date: Aug. 22, 2019

(65) Prior Publication Data
US 2020/0153053 A1 May 14, 2020

(30) Foreign Application Priority Data
Feb. 19, 2018 (KR) .................. 10-2018-0019431

(51) Int. Cl.
*H01M 10/42* (2006.01)
*H01M 10/48* (2006.01)
(Continued)

(52) U.S. Cl.
CPC ....... *H01M 10/4285* (2013.01); *H01M 10/48* (2013.01); *H01M 10/482* (2013.01);
(Continued)

(58) Field of Classification Search
CPC combination set(s) only.
See application file for complete search history.

(56) References Cited

U.S. PATENT DOCUMENTS

2004/0038123 A1* 2/2004 Hisamitsu ......... H01M 10/0413
429/61
2004/0095093 A1* 5/2004 Baba ................... H01M 50/529
320/112
(Continued)

FOREIGN PATENT DOCUMENTS

CN 101599551 A 12/2009
CN 209859989 U 12/2019
(Continued)

OTHER PUBLICATIONS

International Search Report for Application No. PCT/KR2019/001771, dated May 31, 2019, pp. 1-2.
(Continued)

*Primary Examiner* — Amanda J Barrow
(74) *Attorney, Agent, or Firm* — Lerner David LLP

(57) ABSTRACT

A terminal case configured to effectively estimate the life or degradation of a secondary battery as the secondary battery degrades includes a housing that can be coupled to the secondary battery, a plurality of normal mode terminals disposed on a first surface of the housing and a plurality of measurement mode terminals disposed on a second surface of the housing. The housing is configured to be coupled to the secondary battery with either the first surface or the second surface facing the secondary battery, such as by rotation of the housing about an axis passing through a center of two surfaces of the housing that are parallel to one another and perpendicular to both the first and second surfaces of the housing.

10 Claims, 14 Drawing Sheets

(51) Int. Cl.
    *H01M 50/555* (2021.01)
    *H01M 50/557* (2021.01)
    *H01M 50/55* (2021.01)

(52) U.S. Cl.
    CPC ......... *H01M 50/55* (2021.01); *H01M 50/555*
        (2021.01); *H01M 50/557* (2021.01)

(56) References Cited

U.S. PATENT DOCUMENTS

| | | | |
|---|---|---|---|
| 2007/0037048 A1 | 2/2007 | Takeshita et al. | |
| 2009/0297942 A1 | 12/2009 | Jang et al. | |
| 2009/0302804 A1* | 12/2009 | Park | H01M 50/572 |
| | | | 429/178 |
| 2013/0009604 A1 | 1/2013 | Bhardwaj et al. | |
| 2015/0086846 A1 | 3/2015 | Baek et al. | |
| 2020/0153053 A1 | 5/2020 | Han | |
| 2021/0226261 A1 | 7/2021 | Lim et al. | |

FOREIGN PATENT DOCUMENTS

| | | |
|---|---|---|
| CN | 112154566 A | 12/2020 |
| EP | 2131412 A2 | 12/2009 |
| EP | 3051305 A1 | 8/2016 |
| JP | S56108282 A | 8/1981 |
| JP | H07023532 A | 1/1995 |
| JP | 2000067930 A | 3/2000 |
| JP | 2004040914 A | 2/2004 |
| JP | 2005143160 A | 6/2005 |
| JP | 2007048724 A | 2/2007 |
| JP | 2009252373 A | 10/2009 |
| JP | 2010055886 A | 3/2010 |
| JP | 2010176999 A | 8/2010 |
| JP | 2012079582 A | 4/2012 |
| JP | 2013201358 A | 10/2013 |
| JP | 2014017222 A | 1/2014 |
| JP | 2014036434 A | 2/2014 |
| KR | 20090126092 A | 12/2009 |
| KR | 20130126548 A | 11/2013 |
| KR | 20150033023 A | 4/2015 |
| KR | 20150040463 A | 4/2015 |
| KR | 20150060373 A | 6/2015 |
| KR | 20160121179 A | 10/2016 |
| KR | 101726383 B1 | 4/2017 |

OTHER PUBLICATIONS

Written Opinion for Application No. PCT/KR2019/001771, dated May 31, 2019, pp. 1-4.
European Search Report for Application No. EP19754896, dated Oct. 21, 2020, 8 pages.
Search Report dated Apr. 22, 2022 from Office Action for Chinese Application No. 201910120095.3 issued Apr. 26, 2022. 4 pgs.

* cited by examiner

TERMINAL CASE HAVING THE IMPROVED FUNCTION OF ESTIMATING STATE OF SECONDARY BATTERY

CROSS-REFERENCE TO RELATED APPLICATIONS

The present application is a national phase entry under 35 U.S.C. § 371 of International Application No. PCT/KR2019/001771 filed Feb. 13, 2019, which claims priority from Korean Patent Application No. 10-2018-0019431 filed on Feb. 19, 2018, the disclosures of which are incorporated herein by reference in their entirety.

BACKGROUND OF THE DISCLOSURE

Field of the Disclosure

The present disclosure relates to a terminal case having the improved function of estimating state of secondary battery, and more particularly, to a terminal case configured to effectively estimate the life or degradation of a secondary battery as the secondary battery degrades.

Description of the Related Art

Recently, there has been dramatically growing demand for portable electronic products such as laptop computers, video cameras and mobile phones, and with the intense development of electric vehicles, accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries have little or no memory effect and thus they are gaining more attention than nickel-based secondary batteries for their advantages of free charging and discharging, a very low self-discharge rate and high energy density.

A lithium secondary battery mainly uses lithium-based oxide and a carbon material for a positive electrode active material and a negative electrode active material respectively. The lithium secondary battery includes an electrode assembly including a positive electrode plate and a negative electrode plate coated respectively with the positive electrode active material and the negative electrode active material with a separator interposed between, and a packaging material, i.e., a battery case, hermetically sealed to receive the electrode assembly therein together with an electrolyte solution.

In general, lithium secondary batteries may be classified into can-type secondary batteries, in which an electrode assembly is embedded in a metal can, and secondary batteries in which an electrode assembly is embedded in a pouch of an aluminum laminate sheet, according to the shape of the packaging material. These secondary batteries are usually manufactured by receiving the electrode assembly in the packaging material, and in this state, injecting an electrolyte solution, and sealing the packaging material.

More recently, with the extended application range of secondary batteries, secondary batteries are being widely used in small portable devices including smart phones, as well as medium- and large-scale devices such as electric vehicles including hybrid vehicles or energy storage systems.

In the case of a secondary battery, as the usage period increases, the performance degrades compared to the initial state. Additionally, performance degradation estimation of the secondary battery is said to be a State Of Health (SOH) estimation of the secondary battery, and the SOH of the secondary battery is an important factor in determining when to replace the secondary battery.

Additionally, the secondary battery may differ in degradation for each secondary battery depending on environments in which the secondary battery is manufactured and used. Additionally, in the case of a battery pack including a plurality of secondary batteries, it is necessary to accurately estimate the life of each secondary battery as the secondary batteries degrade. Typically, a Battery Management System (BMS) is required to accurately estimate the life of each secondary battery provided in the battery pack, and based on this, operate the battery pack efficiently.

SUMMARY OF THE DISCLOSURE

The present disclosure is designed in view of the background of the related art as described above, and therefore the present disclosure is directed to providing an improved terminal case for effectively estimating the life or degradation of a secondary battery as the secondary battery degrades.

These and other objects and advantages of the present disclosure will be understood by the following description and will be apparent from the embodiments of the present disclosure. Additionally, it will be readily understood that the objects and advantages of the present disclosure are realized by the means set forth in the appended claims and combinations thereof.

To achieve the above-described object, a terminal case according to an aspect of the present disclosure can be connected to a positive electrode lead, a negative electrode lead, a first measuring lead and a second measuring lead included in a secondary battery.

The terminal case may include a housing which can be coupled to the secondary battery. The terminal case may also include a plurality of normal mode terminals which are disposed on a first surface of the housing and can be connected to each of the positive electrode lead, the negative electrode lead, the first measuring lead and the second measuring lead when the first surface faces the secondary battery. The terminal case may further include a plurality of measurement mode terminals which are disposed on a second surface that is different from the first surface of outer surfaces of the housing, which second surface can be connected to each of the positive electrode lead, the negative electrode lead, the first measuring lead and the second measuring lead when the second surface faces the secondary battery.

The plurality of normal mode terminals may be disposed on the first surface at symmetrical positions with the positions of the plurality of measurement mode terminals disposed on the second surface.

The plurality of normal mode terminals may be disposed at corresponding positions to the plurality of measurement mode terminals when the housing is rotated around a rotation axis.

The rotation axis may include a straight line axis that passes through a center of two parallel surfaces which are perpendicular to both the first surface and the second surface of the outer surfaces of the housing.

The housing can be coupled to the secondary battery with the first surface or the second surface facing the secondary battery.

The terminal case according to an embodiment of the present disclosure may further include a detaching element which is coupled to the housing to surround each of the first surface and the second surface, the detaching element fixedly coupling the housing to the secondary battery by surrounding outer surfaces of the secondary battery.

The terminal case according to another embodiment of the present disclosure may further include a rotating element which is coupled to respective locations where a rotation axis of the housing passes through each of any two surfaces except the first surface and the second surface of the outer surfaces of the housing.

The terminal case according to still another embodiment of the present disclosure may further include a connecting element which extends from the rotating element to connect the rotating element to a coupling element coupled to the secondary battery.

The plurality of normal mode terminals may be include a first charge/discharge positive electrode terminal and a first charge/discharge negative electrode.

When the housing is coupled to the secondary battery with the first surface facing the secondary battery, the first charge/discharge positive electrode may be contacted with the first measuring lead, the second measuring lead and the positive electrode lead, and the first charge/discharge negative electrode terminal may be contacted with the negative electrode lead.

The plurality of measurement mode terminals may be include a second charge/discharge positive electrode terminal, a second charge/discharge negative electrode terminal, a first measuring terminal and a second measuring terminal.

When the housing is coupled to the secondary battery with the second surface facing the secondary battery, the second charge/discharge positive electrode terminal may be contacted with the positive electrode lead, the second charge/discharge negative electrode terminal may be contacted with the negative electrode lead, the first measuring terminal may be contacted with the first measuring lead, and the second measuring terminal may be contacted with the second measuring lead.

A battery pack according to another aspect of the present disclosure includes the terminal case according to the present disclosure.

According to an aspect of the present disclosure, there may be provided a terminal case equipped with a plurality of terminals having various shapes to accurately measure a potential difference between two electrode plates.

Additionally, there is provided a structure that can externally measure a reaction non-uniformity phenomenon occurring in the plane direction of a plurality of electrode plates provided in an electrode assembly as a secondary battery degrades, helping to determine the level of degradation of the secondary battery more easily and accurately.

Particularly, it is possible to estimate the level of degradation of the secondary battery rapidly in a simple and convenient manner while the secondary battery is being charged and discharged, by selectively running the terminal case in a normal operating mode, in which the secondary battery is charged/discharged, and in a measurement mode, in which the life or degradation of the secondary battery is estimated.

The present disclosure may have a variety of other effects, and these and other effects of the present disclosure can be understood by the following description and will be apparent from the embodiments of the present disclosure.

BRIEF DESCRIPTION OF THE DRAWINGS

The accompanying drawings illustrate preferred embodiments of the present disclosure, and together with the following detailed description, serve to provide a further understanding of the technical aspects of the present disclosure. However, the present disclosure is not to be construed as being limited to the drawings.

DESCRIPTION OF THE PREFERRED EMBODIMENT

Figure 1:
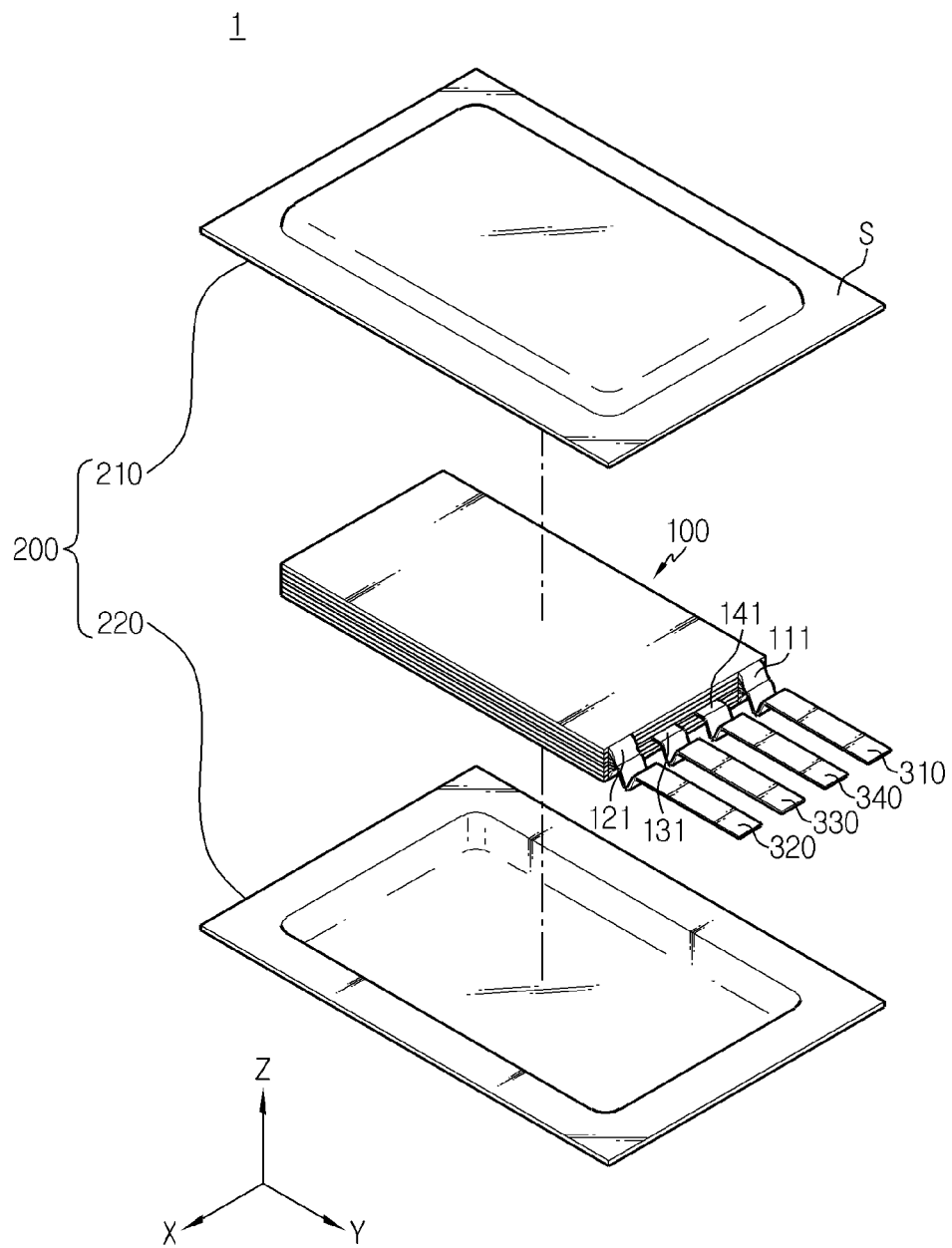
FIG. 1 is a schematic exploded perspective view showing the configuration of a secondary battery according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, but rather interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that other equivalents and modifications could have been made thereto at the time of filing the application.

Additionally, in describing the present disclosure, when it is deemed that a certain detailed description of relevant known elements or functions renders the key subject matter of the present disclosure ambiguous, the detailed description is omitted herein.

Unless the context clearly indicates otherwise, it will be understood that the term "comprises" or "includes" when used in this specification, specifies the presence of stated elements, but does not preclude the presence or addition of one or more other elements. In addition, throughout the specification, it will be further understood that when an element is referred to as being "connected to" another element, it can be directly connected to the other element or intervening elements may be present.

Figure 2:
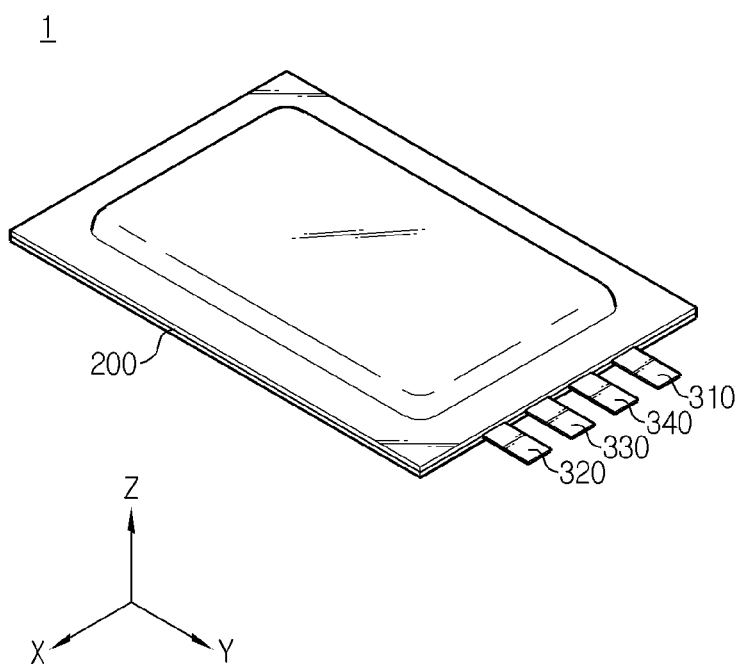
FIG. 2 is an assembled perspective view of the secondary battery shown in FIG. 1.

FIG. 1 is a schematic exploded perspective view showing the configuration of a secondary battery according to an embodiment of the present disclosure, and FIG. 2 is an assembled perspective view of the secondary battery shown in FIG. 1.

Referring to FIGS. 1 and 2, the secondary battery 1 according to the present disclosure includes a packaging material 200, an electrode assembly 100, a positive electrode lead 310, a negative electrode lead 320, a first measuring lead 330 and a second measuring lead 340. The secondary battery 1 may be a pouch type.

The packaging material 200 may have a concave internal space, and the electrode assembly 100 and an electrolyte solution may be received in the internal space.

Particularly, the packaging material 200 may include an upper cover 210 and a lower cover 220, and in this case, the concave internal space may be formed in both the upper cover 210 and the lower cover 220 as shown in FIG. 1.

The packaging material 200 may be formed by sealing the outer periphery of the upper cover 210 and the lower cover 220. That is, each of the upper cover 210 and the lower cover 220 may have a sealing part S at the edges of the internal space, and the internal space of the packaging material 200 may be hermetically closed by sealing the sealing part S by heat fusion.

The electrode assembly 100 may include a separator, a plurality of first electrode plates 110, a plurality of second electrode plates 120, a plurality of first electrode tabs 111, a plurality of second electrode tabs 121, a first measuring plate, a second measuring plate, a first measuring tab and a second measuring tab. Hereinafter, for convenience of description, assume that the first electrode plate is a positive electrode plate and the second electrode plate is a negative electrode plate. In this case, the first electrode tab may be referred to as a positive electrode tab and the second electrode tab may be referred to as a negative electrode tab. Of course, the present disclosure is not limited thereto, and the first electrode plate may be a negative electrode plate and the second electrode plate may be a positive electrode plate.

Figure 3:
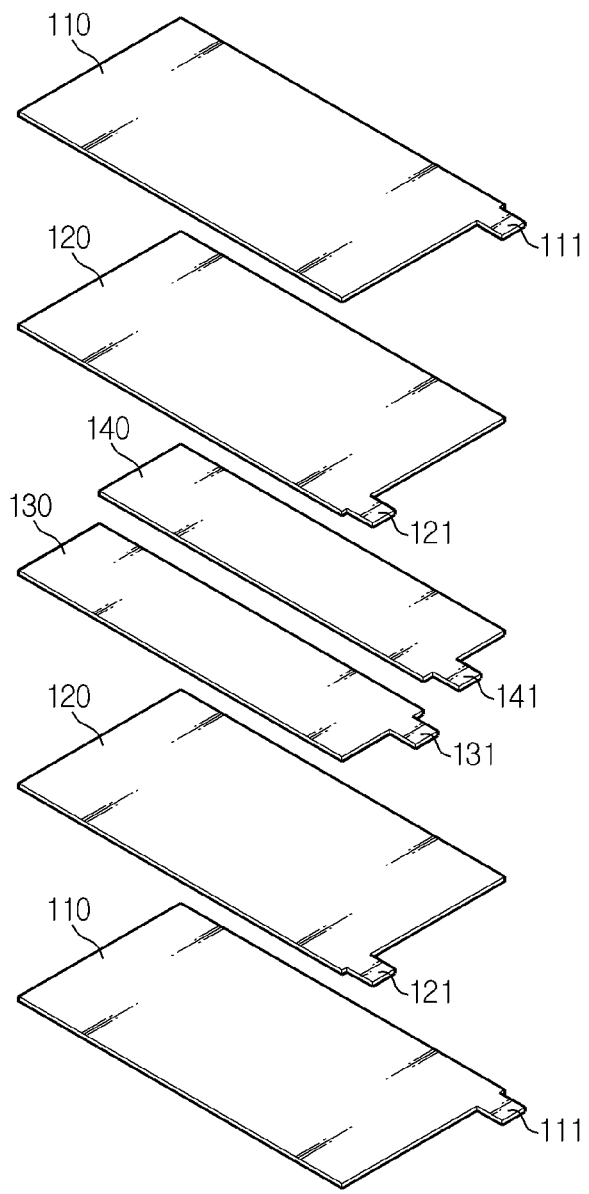
FIG. 3 is a schematic exploded perspective view showing the configuration of an electrode assembly according to an embodiment of the present disclosure.

The configuration of the electrode assembly 100 will be described in detail with reference to FIG. 3. FIG. 3 is a schematic exploded perspective view showing the configuration of the electrode assembly according to an embodiment of the present disclosure. However, for convenience of description, the separator is not shown in FIG. 3. Referring to FIG. 3, the electrode assembly 100 includes a plurality of electrode plates 110, 120, 130 and 140 with the separator interposed between. Particularly, the plurality of electrode plates, stacked with the separator interposed between, is received in the internal space of the packaging material 200.

More specifically, the electrode assembly 100 may include the plurality of positive electrode plates 110 and the plurality of negative electrode plates 120 stacked in an up-down direction.

Here, the electrode plate is the positive electrode plate 110 or the negative electrode plate 120, and the electrode assembly 100 may include the positive electrode plate 110 and the negative electrode plate 120 stacked with their wide surfaces facing each other, and the separator interposed between. That is, the electrode assembly 100 may include the positive electrode plate 110 and the negative electrode plate 120 stacked in an alternating manner with the separator interposed between, and the positive electrode plate 110 and the negative electrode plate 120 are spaced a predetermined distance apart from each other. Additionally, the positive electrode plate 110 and the negative electrode plate 120 are formed by applying an active material slurry to a current collector, and the slurry may be generally formed by shaking a particulate active material, an auxiliary conductor, a binder and a plasticizer with an addition of solvents.

The positive electrode tab 111 may extend from the plurality of positive electrode plates 110, and the negative electrode tab 121 may extend from the plurality of negative electrode plates 120. More specifically, the positive electrode plate 110 may have the positive electrode tab 111 in a non-coated region where the positive electrode active material is not coated, and the negative electrode plate 120 may have the negative electrode tab 121 in a non-coated region where the negative electrode active material is not coated. For example, the positive electrode tab 111 and the negative electrode tab 121 may extend out of the electrode plate, and may be formed by cutting the electrode plate or by attaching a metal plate of a same or different material to the electrode plate.

The first measuring plate 130 and the second measuring plate 140 have the same polarity. For example, both the first measuring plate 130 and the second measuring plate 140 may be a plate having the positive or negative polarity. More specifically, the first measuring plate 130 and the second measuring plate 140 may be formed by applying a positive electrode active material to the surface of an aluminum current collector, or by applying a negative electrode active material to the surface of an aluminum current collector.

The first measuring plate 130 and the second measuring plate 140 may be provided in place of at least one of the positive electrode plate 110 and the negative electrode plate 120. More specifically, the first measuring plate 130 and the second measuring plate 140 may be provided at the position of at least one positive electrode plate 110 or negative electrode plate 120 in place of the at least one positive electrode plate 110 or negative electrode plate 120 of the plurality of positive electrode plates 110 and the plurality of negative electrode plates 120 stacked in an alternating manner in the up-down direction.

For example, the first measuring plate 130 and the second measuring plate 140 may be provided at the position of a positive electrode plate 110 in place of the positive electrode plate 110. In this instance, both the first measuring plate 130 and the second measuring plate 140 may be a plate having the positive polarity. Likewise, the first measuring plate 130 and the second measuring plate 140 may be provided at the position of a negative electrode plate 120 in place of the negative electrode plate 120. In this instance, both the first measuring plate 130 and the second measuring plate 140 may be a plate having the negative polarity.

The first measuring tab 131 is electrically connected to the first measuring plate 130, and the second measuring tab 141 is electrically connected to the second measuring plate 140. Here, the first measuring tab 131 may extend from the first measuring plate 130, and the second measuring tab 141 may extend from the second measuring plate 140. More specifically, the first measuring plate 130 may have the first measuring tab 131 in a non-coated region where the positive electrode active material is not coated, and the second measuring plate 140 may have the second measuring tab 141 in a non-coated region where the negative electrode active material is not coated. For example, the first measuring tab 131 and the second measuring tab 141 may extend out of the first measuring plate 130 and the second measuring plate 140. In this instance, the first measuring tab 131 and the second measuring tab 141 may be formed by cutting the first measuring plate 130 and the second measuring plate 140 or by attaching a metal plate of a same or different material to the first measuring plate 130 and the second measuring plate 140.

One end of the positive electrode lead 310 electrically contacts the positive electrode tab 111, and the other end is exposed outside the packaging material 200. Additionally, a portion of the positive electrode lead 310 is inserted into the packaging material 200. More specifically, the plurality of positive electrode tabs 111 extending out of each of the plurality of positive electrode plates 110 may be connected to the positive electrode lead 310 when they are brought into contact. In this instance, the connection between the plurality of positive electrode tabs 111 and/or the connection between the positive electrode tab 111 and the positive electrode lead 310 may be carried out by a welding process. For example, as shown in FIG. 1, the positive electrode lead 310 may be directly connected to the plurality of positive electrode tabs 111 extending out of the plurality of positive electrode plates 110.

Additionally, the positive electrode lead 310 may be interposed between the upper cover 210 and the lower cover 220 such that part of the positive electrode lead 310 may be disposed in the internal space of the packaging material 200. Additionally, the remaining part of the positive electrode lead 310 may be exposed outside the packaging material 200. For example, as shown in FIG. 2, the positive electrode lead 310 may extend in the outward direction of the packaging material 200 with part of the positive electrode lead 310 exposed outside the packaging material 200.

One end of the negative electrode lead 320 electrically contacts the negative electrode tab 121, and the other end is exposed outside the packaging material 200. Additionally, a portion of the negative electrode lead 320 is inserted into the packaging material 200. More specifically, the plurality of negative electrode tabs 121 extending out of each of the plurality of negative electrode plates 120 may be connected to the negative electrode lead 320 when they are brought into contact. In this instance, the connection between the plurality of negative electrode tabs 121 and/or the connection between the negative electrode tab 121 and the negative electrode lead 320 may be carried out by a welding process. For example, as shown in FIG. 1, the negative electrode lead 320 may be directly connected to the plurality of negative electrode tabs 121 extending out of the plurality of negative electrode plates 120.

Additionally, the negative electrode lead 320 may be interposed between the upper cover 210 and the lower cover 220 such that part of the negative electrode lead 320 may be disposed in the internal space of the packaging material 200. Additionally, the remaining part of the negative electrode lead 320 may be exposed outside the packaging material 200. For example, as shown in FIG. 2, the negative electrode lead 320 may extend in the outward direction of the packaging material 200 with part of the negative electrode lead 320 exposed outside the packaging material 200.

One end of the first measuring lead 330 electrically contacts the first measuring tab 131, and the other end is exposed outside the packaging material 200. Additionally, a portion of the first measuring lead 330 is inserted into the packaging material 200. More specifically, the first measuring tab 131 extending out of the first measuring plate 130 may be connected to the first measuring lead 330. In this instance, the connection between the first measuring tab 131 and the first measuring lead 330 may be carried out by a welding process. For example, as shown in FIG. 1, the first measuring lead 330 may be directly connected to the first measuring tab 131 extending out of the first measuring plate 130.

Additionally, the first measuring lead 330 may be interposed between the upper cover 210 and the lower cover 220 such that part of the first measuring lead 330 may be disposed in the internal space of the packaging material 200. Additionally, the remaining part of the first measuring lead 330 may be exposed outside the packaging material 200. For example, as shown in FIG. 2, the first measuring lead 330 may extend in the outward direction of the packaging material 200 with part of the first measuring lead 330 exposed outside the packaging material 200.

One end of the second measuring lead 340 electrically contacts the second measuring tab 141, and the other end is exposed outside the packaging material 200. Additionally, a portion of the second measuring lead 340 is inserted into the packaging material 200. More specifically, the second measuring tab 141 extending out of the second measuring plate 140 may be connected to the second measuring lead 340. In this instance, the connection between the second measuring tab 141 and the second measuring lead 340 may be carried out by a welding process. For example, as shown in FIG. 1, the second measuring lead 340 may be directly connected to the second measuring tab 141 extending out of the second measuring plate 140.

Additionally, the second measuring lead 340 may be interposed between the upper cover 210 and the lower cover 220 such that part of the second measuring lead 340 may be disposed in the internal space of the packaging material 200. Additionally, the remaining part of the second measuring lead 340 may be exposed outside the packaging material 200. For example, as shown in FIG. 2, the second measuring lead 340 may extend in the outward direction of the packaging material 200 with part of the second measuring lead 340 exposed outside the packaging material 200.

The present disclosure may estimate the state of the secondary battery using the first measuring lead 330 and the second measuring lead 340. Particularly, the present disclosure may estimate the life or degradation of the secondary battery using a potential difference between the first measuring lead 330 and the second measuring lead 340. For example, as the secondary battery 1 degrades, a potential difference occurs between the first measuring lead 330 and the second measuring lead 340, and the life of the secondary battery may be estimated according to the degree of the potential difference occurred.

The first measuring tab 131 may be integrated into one plate with the first measuring lead 330. Additionally, the second measuring tab 141 may be integrated into one plate with the second measuring lead 340.

Additionally, the positive electrode lead 310, the negative electrode lead 320, the first measuring lead 330 and the second measuring lead 340 may run in the same direction from the packaging material 200. For example, as shown in FIGS. 1 and 2, the positive electrode lead 310, the negative electrode lead 320, the first measuring lead 330 and the second measuring lead 340 may extend in +y-axis direction of FIGS. 1 and 2.

According to this configuration of the present disclosure, it is possible to easily measure the voltage across the first measuring lead and the second measuring lead. Particularly, the first measuring lead 330 and the second measuring lead 340 may easily come into contact with measuring terminals that are connected to the first measuring lead 330 and the second measuring lead 340.

Additionally, the first measuring tab 131 and the second measuring tab 141 may be formed at different positions in the horizontal direction from the positions of the positive electrode tab 111 and the negative electrode tab 121 between the positive electrode tab 111 and the negative electrode tab 121. That is, the first measuring lead 330 and the second measuring lead 340 may be formed in parallel to the positive electrode lead 310 and the negative electrode lead 320. For example, as shown in FIG. 1, the first measuring tab 131 and the second measuring tab 141 may be formed at positions located at a predetermined distance apart in x-axis direction or in x- and z-axis direction from the positive electrode tab 111 and the negative electrode tab 121 between the positive electrode tab 111 and the negative electrode tab 121. Additionally, the positive electrode lead 310, the negative electrode lead 320, the first measuring lead 330 and the second measuring lead 340 may be formed in parallel such that parts of the positive electrode lead 310, the negative electrode lead 320, the first measuring lead 330 and the second measuring lead 340 extending out of the packaging material 200 may run in parallel. Specifically, the positive electrode lead 310, the negative electrode lead 320, the first measuring lead 330 and the second measuring lead 340 may be disposed on the same virtual plane such that each of their lengthwise directions may face the same direction. For example, referring to FIG. 2, the positive electrode lead 310, the negative electrode lead 320, the first measuring lead 330 and the second measuring lead 340 may be disposed on the same plane such that each of their upper surfaces may run in parallel and each of their lengthwise directions may face the same +y direction. According to this configuration of the present disclosure, it is possible to easily charge and discharge the secondary battery and estimate the state of the secondary battery. Particularly, according to this configuration of the present disclosure, the state of the secondary battery may be easily estimated by the first measuring tab and the second measuring tab formed at different positions in the horizontal direction from the positive electrode tab and the negative electrode tab used to charge and discharge the secondary battery.

Referring to FIG. 3, the electrode assembly 100 according to the present disclosure may include the plurality of electrode plates stacked in the up-down direction. Particularly, the first measuring plate 130 and the second measuring plate 140 may be provided in place of at least one electrode plate of the plurality of positive electrode plates 110 and the plurality of negative electrode plates 120. More specifically, the first measuring plate 130 and the second measuring plate 140 may be stacked in the same layer in the electrode assembly 100 having a stack of the plurality of electrode plates.

For example, as shown in FIG. 3, the first measuring plate 130 and the second measuring plate 140 may be provided at the position of a positive electrode plate 110 in place of the positive electrode plate 110. That is, the first measuring plate 130 and the second measuring plate 140 may be provided in the same layer between two negative electrode plates 120. Additionally, although not shown in the drawing, the first measuring plate 130 and the second measuring plate 140 may be provided at the position of a negative electrode plate 120 in place of the negative electrode plate 120. That is, the first measuring plate 130 and the second measuring plate 140 may be provided in the same layer between two positive electrode plates 110. According to this configuration of the present disclosure, it is possible to measure a potential difference caused by non-uniformity inside the secondary battery and thus estimate the state of the secondary battery more accurately.

Figure 4:
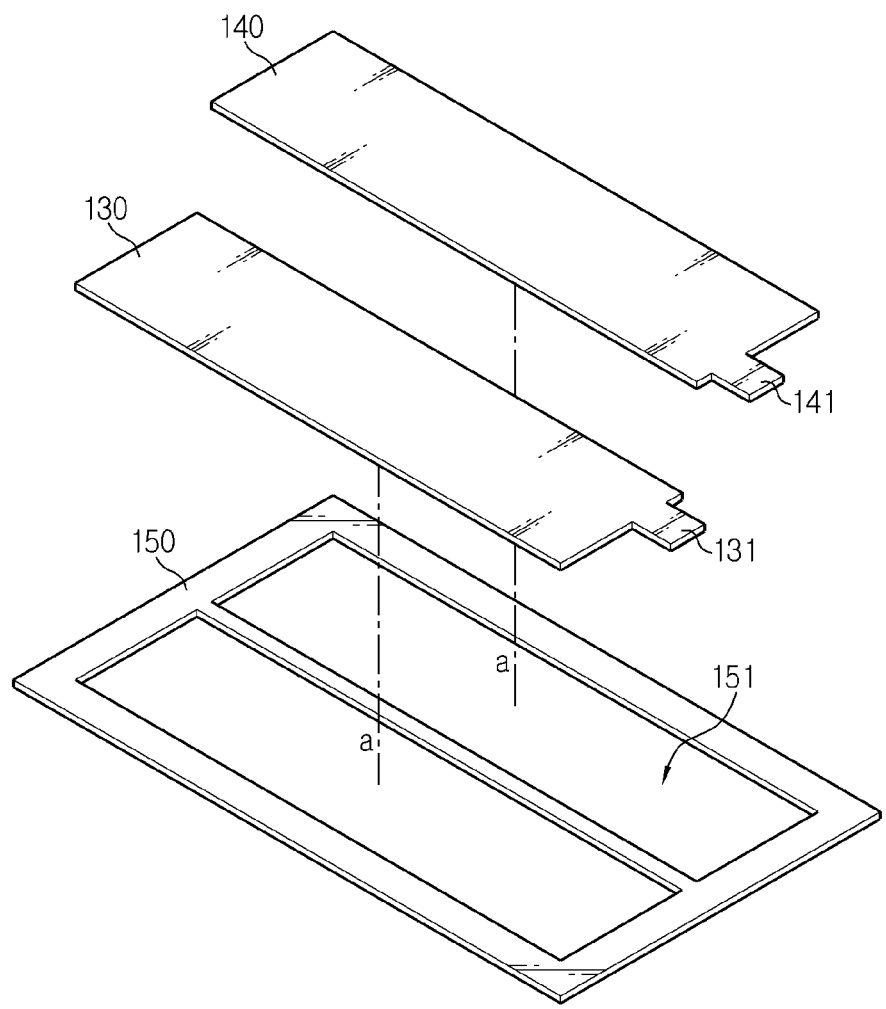
FIGS. 4 and 5 are schematic exploded perspective views showing the connection of a measuring plate and an insulating element according to different embodiments of the present disclosure.
Figure 5:
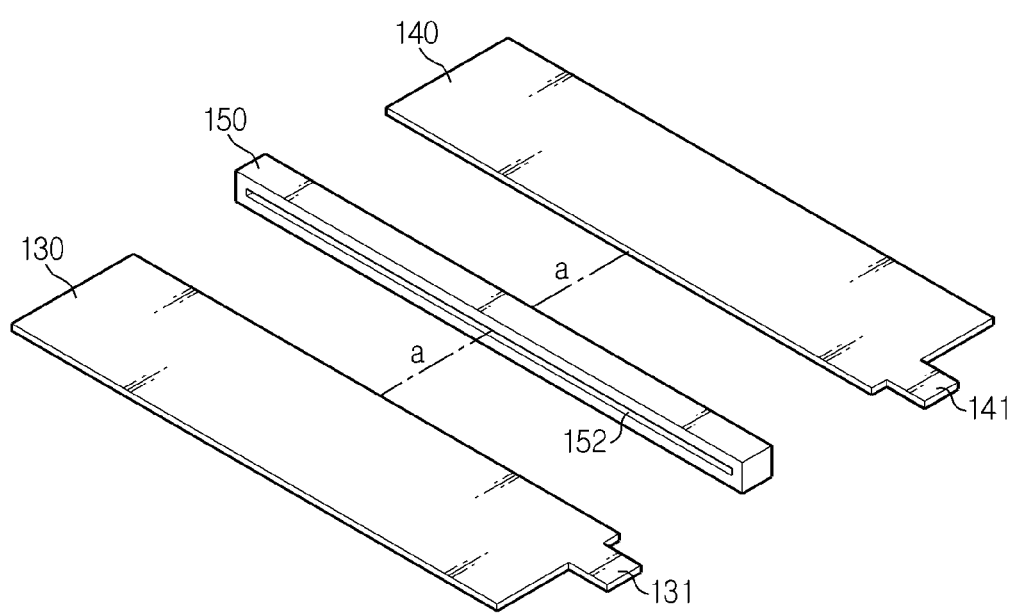

The electrode assembly 100 according to the present disclosure may further include an insulating element 150. This will be described in more detail with reference to FIGS. 4 and 5. FIGS. 4 and 5 are schematic exploded perspective views showing connection of the measuring plate and the insulating element according to different embodiments of the present disclosure.

Referring to FIGS. 4 and 5, the insulating element 150 may fix the first measuring plate 130 and the second measuring plate 140. More specifically, the insulating element 150 may fix the first measuring plate 130 and the second measuring plate 140 such that the first measuring plate 130 and the second measuring plate 140 may be disposed in parallel in one layer among the plurality of electrode plates.

For example, as shown in FIG. 4, the insulating element 150 may be made of an insulating material, and may be implemented as a plate of the same size as the electrode plate provided in the electrode assembly 100. Additionally, the insulating element 150 may have an internal space 151 of the same size as the area of the first measuring plate 130 and the second measuring plate 140. Here, the internal space 151 may be an empty space that is open in the vertical direction, with the open top and bottom in the same size as the area of the first measuring plate 130 and the second measuring plate 140 as shown in FIG. 4. Additionally, the first measuring plate 130 and the second measuring plate 140 may be provided in the internal space 151. Here, the first measuring plate 130 and the second measuring plate 140 may be inserted and fixed into the internal space 151 of the insulating element 150 in the direction a of FIG. 4. In this instance, the internal space into which the first measuring plate 130 is inserted and the internal space into which the second measuring plate 140 is inserted may be spaced a predetermined distance apart in a first direction. Here, the first direction may include the x-axis direction shown in FIGS. 2 and 3. Accordingly, the first measuring plate 130 and the second measuring plate 140 may be coupled to the insulating element 150 and kept in electrically insulated state. As another example, as shown in FIG. 5, the insulating element 150 may be made of an insulating material and disposed between the first measuring plate 130 and the second measuring plate 140. For example, the insulating element 150 may be formed in the shape of a bar that extends in the lengthwise direction of the first measuring plate 130 and the second measuring plate 140. Additionally, the insulating element 150 may be interposed between the first measuring plate 130 and the second measuring plate 140 arranged in parallel in the horizontal direction, namely, the first direction, with wide surfaces lying upwards and downwards, to separate the first measuring plate 130 from the second measuring plate 140. Through the insulating element 150, the first measuring plate 130 and the second measuring plate 140 may be kept in electrically insulated state.

Particularly, the insulating element 150 may be configured such that the first measuring plate 130 and the second measuring plate 140 may be inserted into the insulating element 150. More specifically, the insulating element 150 may have an inner groove 152. The inner groove 152 may extend straight in the lengthwise direction of the first measuring plate 130 and the second measuring plate 140 such that the first measuring plate 130 and the second measuring plate 140 are coupled to the inner groove 152. Here, the first measuring plate 130 and the second measuring plate 140 may be inserted and fixed into the inner groove 152 of the insulating element 150 in the direction a of FIG. 5.

Additionally, the insulating element 150 may electrically insulate the first measuring plate 130 from the second measuring plate 140. More specifically, the insulating element 150 may separate the first measuring plate 130 from the second measuring plate 140 to maintain a predetermined distance between the first measuring plate 130 and the second measuring plate 140. Additionally, the insulating element 150 may be made of an insulating material, to prevent the contact between the first measuring plate 130 and the second measuring plate 140. For example, as shown in FIGS. 4 and 5, the first measuring plate 130 and the second measuring plate 140 may be spaced apart by the insulating element 150 to prevent the contact between.

Figure 6:
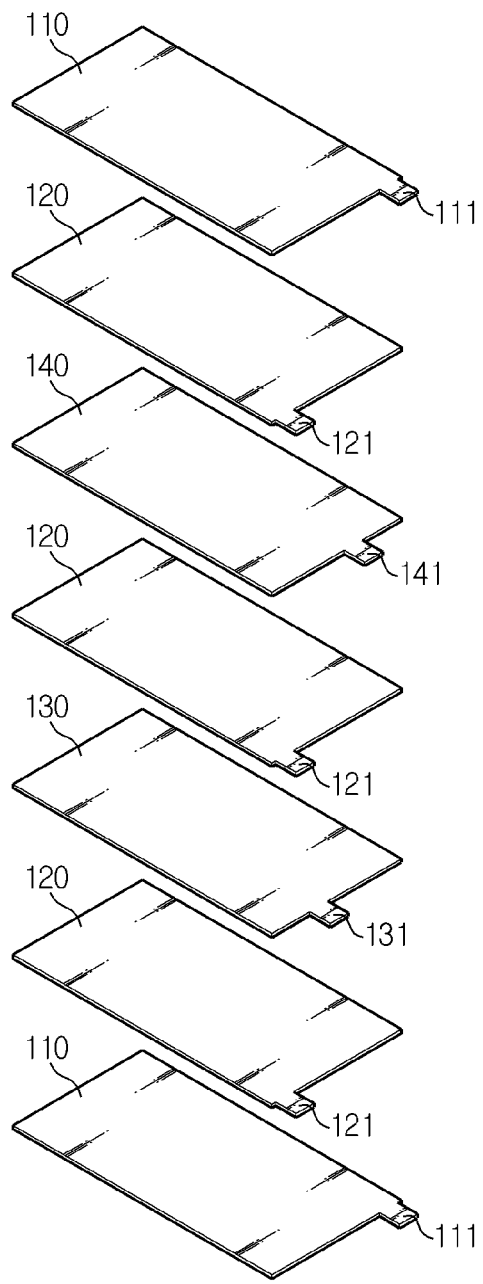
FIG. 6 is a schematic exploded perspective view showing the configuration of an electrode assembly according to another embodiment of the present disclosure.

FIG. 6 is a schematic exploded perspective view showing the configuration of the electrode assembly according to another embodiment of the present disclosure. However, for convenience of description, the separator is not shown in FIG. 6. Additionally, in this embodiment, for the parts to which the description of the previous embodiment may be similarly applied, a detailed description is omitted herein, and it will be described primarily based on difference(s).

Referring to FIG. 6, the electrode assembly 100 according to the present disclosure may include the plurality of electrode plates 110, 120, 130 and 140 stacked in the up-down direction. Particularly, the first measuring plate 130 and the second measuring plate 140 may be provided at the position of two electrode plates having the same polarity in place of the two electrode plates among the plurality of positive electrode plates 110 and the plurality of negative electrode plates 120. That is, the first measuring plate 130 may be provided in place of a specific electrode plate of the plurality of positive electrode plates 110 and the plurality of negative electrode plates 120, and the second measuring plate 140 may be provided in place of a different electrode plate having the same polarity as the above specific electrode plate of the plurality of positive electrode plates 110 and the plurality of negative electrode plates 120. The first measuring plate 130 and the second measuring plate 140 may be stacked in different layers.

For example, as shown in FIG. 6, each of the first measuring plate 130 and the second measuring plate 140 may be provided at the position of each of two positive electrode plates 110 in place of the two positive electrode plates 110. That is, the first measuring plate 130 may be provided at the position of a first positive electrode plate among the plurality of positive electrode plates 110, and the second measuring plate 140 may be provided at the position of a second positive electrode plate that is not identical to the first positive electrode plate among the plurality of positive electrode plates 110. Accordingly, each of the first measuring plate 130 and the second measuring plate 140 may be provided between the negative electrode plates, and the first measuring plate 130 and the second measuring plate 140 may be provided in different layers.

Additionally, although not shown in the drawing, the first measuring plate 130 and the second measuring plate 140 may be provided at the position of two negative electrode plates 120 in place of the two negative electrode plates 120. That is, the first measuring plate 130 may be provided at the position of a first negative electrode plate among the plurality of negative electrode plates 120, and the second measuring plate 140 may be provided at the position of a second negative electrode plate that is not identical to the first negative electrode plate among the plurality of negative electrode plates 120. Accordingly, each of the first measuring plate 130 and the second measuring plate 140 may be provided between the positive electrode plates, and the first measuring plate 130 and the second measuring plate 140 may be provided in different layers.

According to this configuration of the present disclosure, the first measuring plate and the second measuring plate are not included in any one of the positive electrode plate and the negative electrode plate such that they are spaced a predetermined distance apart, and instead, two selected from the plurality of positive electrode plates or two selected from the plurality of negative electrode plates are replaced with the first measuring plate and the second measuring plate in the manufacture of the secondary battery according to the present disclosure, which makes it easier to manufacture the secondary battery.

Figure 7:
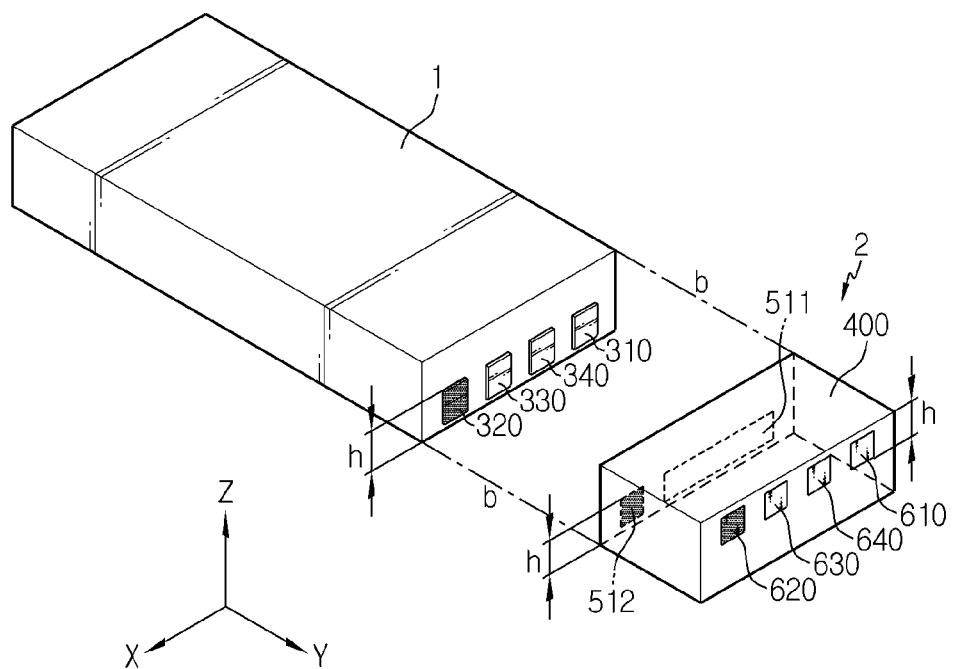
FIG. 7 is a schematic perspective view showing the partial configuration of a secondary battery and a terminal case according to an embodiment of the present disclosure.
Figure 8:
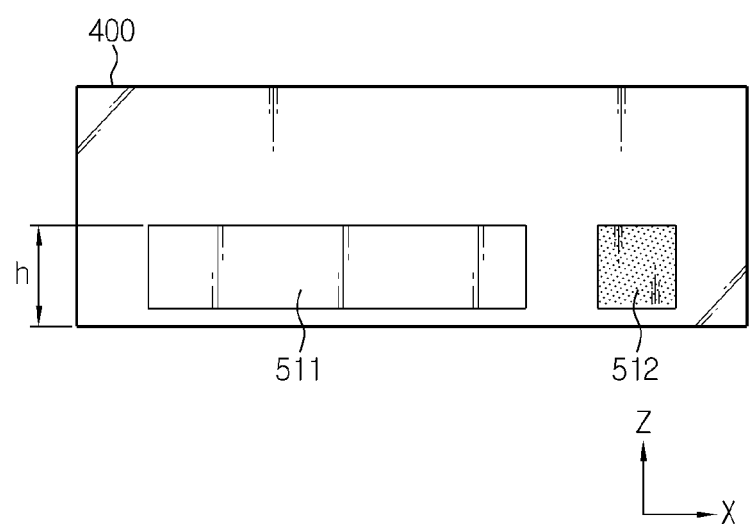
FIGS. 8 and 9 are schematic diagrams showing the configuration of a plurality of normal mode terminals and a plurality of measurement mode terminals of FIG. 7, respectively.
Figure 9:
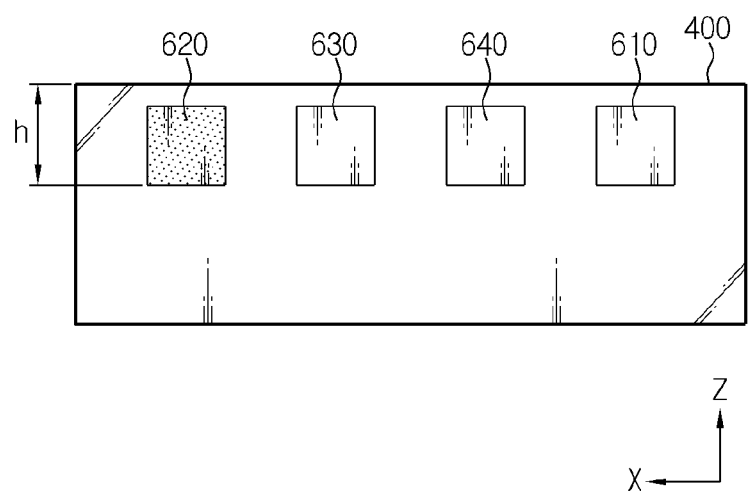

FIG. 7 is a schematic perspective view showing the partial configuration of the secondary battery and the terminal case according to an embodiment of the present disclosure. Additionally, FIGS. 8 and 9 are schematic diagrams showing the configuration of the plurality of normal mode terminals and the plurality of measurement mode terminals of FIG. 7, respectively.

The terminal case 2 according to the present disclosure may be coupled to the secondary battery 1 to estimate the degradation of the secondary battery 1. Additionally, the terminal case 2 according to the present disclosure may be used to estimate the state of the secondary battery 1, and may be used to estimate the life of the secondary battery 1. Particularly, as the terminal case 2 can be connected to the positive electrode lead 310, the negative electrode lead 320, the first measuring lead 330, and the second measuring lead 340 provided in the secondary battery 1, the terminal case 2 may be applied to an apparatus for estimating the life of the secondary battery 1.

The outer surfaces of the secondary battery 1 according to the present disclosure may be taped. For example, as shown in FIG. 7, the secondary battery 1 may be formed in the shape of a rectangular prism with the taped outer surfaces. Additionally, the secondary battery 1 may include the plurality of leads on one surface. For example, as shown in FIG. 7, the secondary battery 1 may include the positive electrode lead 310, the negative electrode lead 320, the first measuring lead 330 and the second measuring lead 340 on one surface in +y-axis direction of FIG. 7.

The positive electrode lead 310, the negative electrode lead 320, the first measuring lead 330 and the second measuring lead 340 according to the present disclosure may be bent in upward or downward direction. More specifically, the positive electrode lead 310, the negative electrode lead 320, the first measuring lead 330 and the second measuring lead 340 may be bent in upward or downward direction with flat surfaces facing the outer side of the secondary battery 1. For example, as shown in FIG. 7, the positive electrode lead 310, the negative electrode lead 320, the first measuring lead 330 and the second measuring lead 340 may be bent in +z-axis direction or −z-axis direction, with flat surfaces facing in +y-axis direction.

The height of the positive electrode lead 310, the negative electrode lead 320, the first measuring lead 330 and the second measuring lead 340 may be lower than the height of one surface of the secondary battery 1. Specifically, the bent part of each of the positive electrode lead 310, the negative electrode lead 320, the first measuring lead 330 and the second measuring lead 340 may have a height corresponding to a half of the height of one surface. For example, as shown in FIG. 7, the positive electrode lead 310, the negative electrode lead 320, the first measuring lead 330 and the second measuring lead 340 may be bent as high as a predetermined height h in the upward direction (in z-axis direction) from the lower surface of the secondary battery 1. According to this configuration of the present disclosure, the plurality of leads may easily come into contact with the measuring terminals.

The terminal case 2 according to the present disclosure includes the housing 400, the plurality of normal mode terminals and the plurality of measurement mode terminals.

The housing 400 may be coupled to one surface of the secondary battery 1 having the positive electrode lead 310, the negative electrode lead 320, the first measuring lead 330, and the second measuring lead 340. For example, as shown in FIG. 7, the housing 400 may be coupled to one side of the secondary battery 1 in the direction b of FIG. 7.

The housing 400 may be coupled to the secondary battery 1 with a first surface of the housing 400 or a second surface of the housing 400 facing the secondary battery 1. The housing 400 may have a coupling portion and may be coupled to one side of the secondary battery 1. For example, although not shown in the drawing, the housing 400 may have the coupling portion extending in the direction of the secondary battery 1 from the housing 400 on a surface of −y-axis direction of FIG. 7, and the secondary battery 1 may have a predefined groove into which the coupling portion is fixed. Additionally, when the housing 400 approaches the secondary battery 1 in −y-axis direction of FIG. 7, the coupling portion may be fixed into the groove.

The plurality of normal mode terminals may include an electrically conductive material such as metal. Additionally, these terminals may be formed in the shape of a plate. Additionally, the plurality of normal mode terminals may be provided in an inner surface facing the electrode lead of the secondary battery 1. That is, the plurality of normal mode terminals may be disposed on the first surface of the housing 400 facing the secondary battery 1. Here, the first surface may be one surface configured to be coupled with the secondary battery 1 in the housing 400.

Additionally, the plurality of normal mode terminals may be connected to each of the positive electrode lead 310, the negative electrode lead 320, the first measuring lead 330 and the second measuring lead 340. Specifically, the plurality of normal mode terminals may selectively contact each of the positive electrode lead 310, the negative electrode lead 320, the first measuring lead 330 and the second measuring lead 340. Particularly, the plurality of normal mode terminals according to the present disclosure may contact the positive electrode lead 310, the negative electrode lead 320, the first measuring lead 330 and the second measuring lead 340 provided in the secondary battery 1 when charging or discharging the secondary battery 1.

The plurality of normal mode terminals may be disposed at a predetermined height h in the upward direction (in +z-axis direction) from the lower surface of the housing 400.

Through this configuration, the plurality of normal mode terminals may accurately contact the positive electrode lead 310, the negative electrode lead 320, the first measuring lead 330 and the second measuring lead 340 provided in the secondary battery 1.

The plurality of measurement mode terminals may be made of an electrically conductive material such as metal. Additionally, the plurality of measurement mode terminals may be formed in the shape of a plate. Additionally, the plurality of measurement mode terminals may be disposed on the outer surface provided in the outward direction from the inner surface facing the positive electrode lead 310, the negative electrode lead 320, the first measuring lead 330 and the second measuring lead 340 of the secondary battery 1. That is, the plurality of measurement mode terminals may be disposed on the second surface of the housing 400 that is different from the first surface.

The plurality of normal mode terminals may be provided, in the first surface, at the position that is symmetrical with the plurality of measurement mode terminals disposed on the second surface. That is, when the housing 400 is rotated, the plurality of normal mode terminals may be provided at the position on the first surface that is symmetrical with the position of the plurality of measurement mode terminals.

For example, the plurality of measurement mode terminals may be disposed on the second surface of the housing 400 disposed in +y-axis direction of FIG. 7 from the first surface having the plurality of normal mode terminals. Referring to FIG. 7, the first surface having the plurality of normal mode terminals may be parallel to the second surface having the plurality of measurement mode terminals. However, the first surface having the plurality of normal mode terminals and the second surface having the plurality of measurement mode terminals may be different outer surfaces of the housing 400, and they are not limited to parallel surfaces.

Additionally, the plurality of measurement mode terminals may come into contact with and be connected to the positive electrode lead 310, the negative electrode lead 320, the first measuring lead 330 and the second measuring lead 340.

The plurality of measurement mode terminals may be disposed on the second surface of the housing 400, and may be disposed at a predetermined height h in the downward direction (in −z-axis direction) from the upper surface of the housing 400. Accordingly, the plurality of measurement mode terminals may accurately contact the plurality of electrode leads provided in the secondary battery 1.

The plurality of normal mode terminals and the plurality of measurement mode terminals may be respectively disposed on the first surface of the housing 400 and the second surface of the housing 400 such that they are symmetrical with each other in the up-down direction. For example, as shown in FIG. 7, when the first surface of the housing 400 faces the secondary battery 1, the plurality of normal mode terminals may be disposed at the lower part of the first surface, and the plurality of measurement mode terminals may be disposed at the upper part of the second surface. On the contrary, when the second surface faces the secondary battery 1 by rotation of the housing 400, the plurality of measurement mode terminals may be disposed at the lower part of the second surface, and the plurality of normal mode terminals may be disposed at the upper part of the first surface.

The plurality of normal mode terminals according to an embodiment of the present disclosure may include a first charge/discharge positive electrode terminal 511 and a first charge/discharge negative electrode terminal 512. Additionally, the first charge/discharge positive electrode terminal 511 and the first charge/discharge negative electrode terminal 512 may be made of an electrically conductive material such as metal.

The first charge/discharge positive electrode terminal 511 may contact all the first measuring lead 330, the second measuring lead 340 and the positive electrode lead 310. Additionally, the first charge/discharge negative electrode terminal 512 may contact the negative electrode lead 320.

For example, as shown in FIGS. 7 and 8, the first charge/discharge positive electrode terminal 511 and the first charge/discharge negative electrode terminal 512 may be disposed at the position facing the positive electrode lead 310, the negative electrode lead 320, the first measuring lead 330 and the second measuring lead 340 bent to face the outer surface of the secondary battery 1, and each may contact the corresponding lead.

The plurality of measurement mode terminals according to an embodiment of the present disclosure may include a second charge/discharge positive electrode terminal 610, a second charge/discharge negative electrode terminal 620, a first measuring terminal 630 and a second measuring terminal 640. Additionally, the second charge/discharge positive electrode terminal 610, the second charge/discharge negative electrode terminal 620, the first measuring terminal 630 and the second measuring terminal 640 may be made of an electrically conductive material such as metal.

The second charge/discharge positive electrode terminal 610 may contact the positive electrode lead 310, and the second charge/discharge negative electrode terminal 620 may contact the negative electrode lead 320. Additionally, the first measuring terminal 630 may contact the first measuring lead 330, and the second measuring terminal 640 may contact the second measuring lead 340.

For example, as shown in FIGS. 7 and 9, the second charge/discharge positive electrode terminal 610, the second charge/discharge negative electrode terminal 620, the first measuring terminal 630 and the second measuring terminal 640 may each contact the corresponding electrode lead among the positive electrode lead 310, the negative electrode lead 320, the first measuring lead 330 and the second measuring lead 340 of the secondary battery 1.

Figure 10:
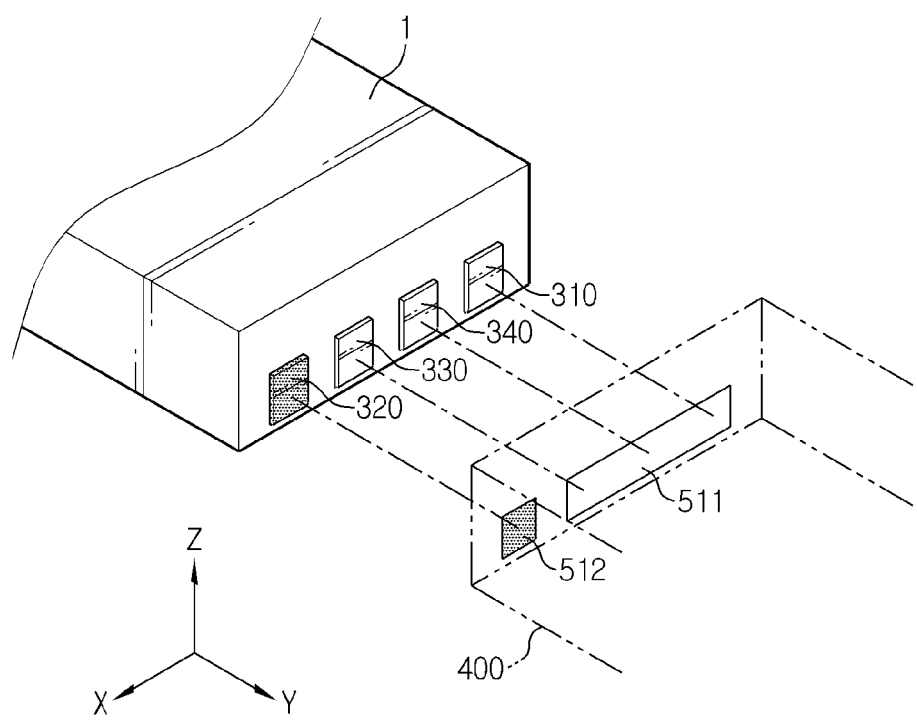
FIGS. 10 and 11 are schematic diagrams showing the connection of a plurality of electrode leads provided in a secondary battery to a plurality of normal mode terminals and a plurality of measurement terminals provided in a housing, respectively, according to an embodiment of the present disclosure.
Figure 11:
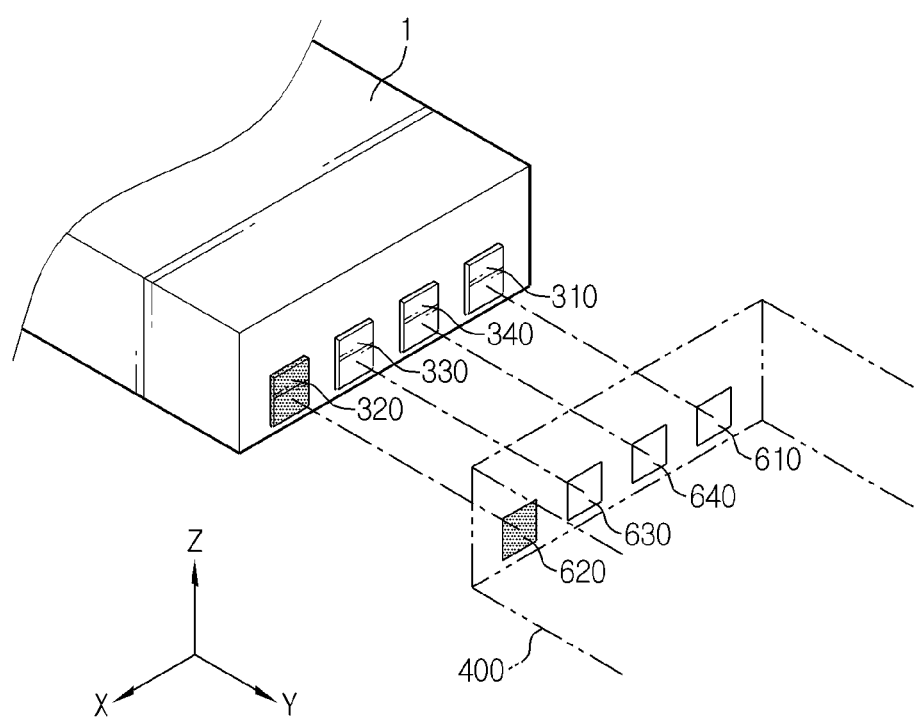

FIGS. 10 and 11 are schematic diagrams showing the connection of the plurality of electrode leads provided in the secondary battery to the plurality of normal mode terminals and the plurality of measurement mode terminals provided in the housing, respectively, according to an embodiment of the present disclosure.

First, referring to FIG. 10, the plurality of normal mode terminals according to the present disclosure may contact the positive electrode lead 310, the negative electrode lead 320, the first measuring lead 330 and the second measuring lead 340 provided in the secondary battery 1. In this case, the housing 400 may be coupled to the secondary battery 1 with the first surface of the housing 400 facing the secondary battery 1.

The first charge/discharge positive electrode terminal 511 may contact the positive electrode lead 310 of the secondary battery 1. Additionally, when the first measuring lead 330 and the second measuring lead 340 are a lead having the positive polarity, the first charge/discharge positive electrode terminal 511 may contact the first measuring lead 330 and the second measuring lead 340. Additionally, the first charge/discharge positive electrode terminal 511 may extend straight in the widthwise direction such that the first charge/discharge positive electrode terminal 511 may contact all the first measuring lead 330, the second measuring lead 340 and the positive electrode lead 310. For example, as shown in FIG. 10, the first charge/discharge positive electrode terminal 511 may extend straight in x-axis direction. Through this configuration, when the secondary battery 1 is charged or discharged, the first charge/discharge positive electrode terminal 511 may be electrically connected to the plurality of first electrode plates 110, the first measuring plate 130 and the second measuring plate 140 having the positive polarity included in the secondary battery 1.

The first charge/discharge negative electrode terminal 512 electrically contact the negative electrode lead 320 of the secondary battery 1. To this end, when the housing 400 is coupled to the secondary battery 1, the first charge/discharge negative electrode terminal 512 may be provided at the position facing the negative electrode lead 320. For example, as shown in FIG. 10, the first charge/discharge negative electrode terminal 512 may be connected to the negative electrode lead 320 in a one-to-one relationship. That is, when the secondary battery 1 is charged or discharged, the first charge/discharge negative electrode terminal 512 may be electrically connected to the plurality of negative electrode plates 120 included in the secondary battery 1. For example, as shown in FIG. 10, the first charge/discharge negative electrode terminal 512 may face the negative electrode lead 320, spaced a predetermined distance apart in +x-axis direction from the first charge/discharge positive electrode terminal 511.

Meanwhile, although not shown in the drawing, when the first measuring lead 330 and the second measuring lead 340 are leads having a negative polarity, the first charge/discharge negative electrode terminal 512 may electrically contact the first measuring lead 330 and the second measuring lead 340. In this case, the first charge/discharge negative electrode terminal 512 may extend straight in the widthwise direction (in x-axis direction).

Referring to FIG. 11, the plurality of measurement mode terminals according to the present disclosure may contact the plurality of electrode leads provided in the secondary battery 1. In this case, the housing 400 may be coupled to the secondary battery 1 with the second surface of the housing 400 facing the secondary battery 1.

When the housing 400 is coupled to the secondary battery 1 with the second surface of the housing 400 facing the secondary battery 1, the second charge/discharge positive electrode terminal 610 may be provided at the position facing the positive electrode lead 310. The second charge/discharge positive electrode terminal 610 may be electrically connected to the positive electrode lead 310. Specifically, the second charge/discharge positive electrode terminal 610 may be connected to the positive electrode lead 310 in a one-to-one relationship as shown in FIG. 11.

When the housing 400 is coupled to the secondary battery 1 with the second surface of the housing 400 facing the secondary battery 1, the second charge/discharge negative electrode terminal 620 may be provided at the position facing the negative electrode lead 320. The second charge/discharge negative electrode terminal 620 may be electrically connected to the negative electrode lead 320. Specifically, the second charge/discharge negative electrode terminal 620 may be connected to the negative electrode lead 320 in a one-to-one relationship as shown in FIG. 11.

When the housing 400 is coupled to the secondary battery 1 with the second surface of the housing 400 facing the secondary battery 1, the first measuring terminal 630 may be provided at the position facing the first measuring lead 330. The first measuring terminal 630 may be electrically connected to the first measuring lead 330. More specifically, the first measuring terminal 630 may be connected to the first measuring lead 330 in a one-to-one relationship as shown in FIG. 11.

When the housing 400 is coupled to the secondary battery 1 with the second surface of the housing 400 facing the secondary battery 1, the second measuring terminal 640 may be provided at the position facing the second measuring lead 340. The second measuring terminal 640 may be electrically connected to the second measuring lead 340. Specifically, the second measuring terminal 640 may be connected to the second measuring lead 340 in a one-to-one relationship as shown in FIG. 11.

The first measuring terminal 630 may be electrically connected to the first measuring plate 130 provided in the electrode assembly 100 through the first measuring lead 330, and the second measuring terminal 640 may be electrically connected to the second measuring plate 140 provided in the electrode assembly 100 through the second measuring lead 340.

Figure 12:
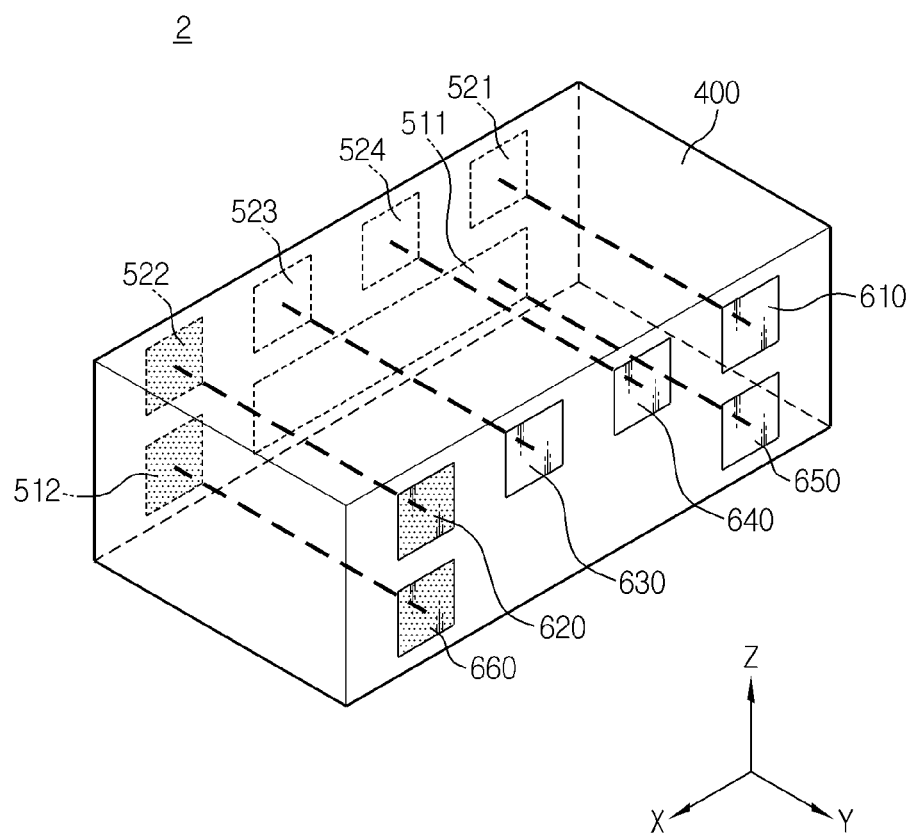
FIG. 12 is a schematic diagram showing an arrangement relationship of a plurality of terminals provided in a terminal case according to an embodiment of the present disclosure.

FIG. 12 is a schematic diagram showing the arrangement relationship of the plurality of terminals provided in the terminal case according to an embodiment of the present disclosure.

Referring to FIG. 12, the terminal case 2 according to the present disclosure may include the first charge/discharge positive electrode terminal 511, the first charge/discharge negative electrode terminal 512, a fourth charge/discharge positive electrode terminal 521, a fourth charge/discharge negative electrode terminal 522, a third measuring terminal 523 and a fourth measuring terminal 524 in the first surface of the housing 400. Additionally, the terminal case 2 may include the second charge/discharge positive electrode terminal 610, the second charge/discharge negative electrode terminal 620, the first measuring terminal 630, the second measuring terminal 640, a third charge/discharge positive electrode terminal 650 and a third charge/discharge negative electrode terminal 660 in the second surface of the housing 400. Here, the first surface of the housing 400 may refer to one surface of the housing 400 provided in −y-axis direction of FIG. 12. Additionally, the second surface of the housing 400 may refer to one surface of the housing 400 provided in +y-axis direction of FIG. 12.

The plurality of terminals disposed on each of the first surface and the second surface of the housing 400 according to the present disclosure may be connected to each other. For example, the terminal case 2 may include an electrical circuit in the housing 400 to electrically connect the plurality of terminals.

First, the first charge/discharge positive electrode terminal 511 disposed on the first surface of the housing 400 may be connected to the third charge/discharge positive electrode terminal 650 disposed on the second surface of the housing 400, and the first charge/discharge negative electrode terminal 512 may be connected to the third charge/discharge negative electrode terminal 660 disposed on the second surface of the housing 400.

For example, when the first surface of the housing 400 is coupled to the secondary battery 1, the first charge/discharge positive electrode terminal 511 and the first charge/discharge negative electrode terminal 512 may contact the electrode leads of the secondary battery 1. Additionally, the third charge/discharge positive electrode terminal 650 and the third charge/discharge negative electrode terminal 660 may transmit and receive the charge/discharge current through the first charge/discharge positive electrode terminal 511 and the first charge/discharge negative electrode terminal 512.

Subsequently, the second charge/discharge positive electrode terminal 610, the second charge/discharge negative electrode terminal 620, the first measuring terminal 630 and the second measuring terminal 640 disposed on the second surface of the housing 400 may be respectively connected to the fourth charge/discharge positive electrode terminal 521, the fourth charge/discharge negative electrode terminal 522, the third measuring terminal 523 and the fourth measuring terminal 524 disposed on the first surface of the housing 400. For example, as shown in FIG. 12, the second charge/discharge positive electrode terminal 610 may be connected to the fourth charge/discharge positive electrode terminal 521 in a one-to-one relationship, and the second charge/discharge negative electrode terminal 620 may be connected to the fourth charge/discharge negative electrode terminal 522 in a one-to-one relationship. Additionally, the first measuring terminal 630 may be connected to the third measuring terminal 523 in a one-to-one relationship, and the second measuring terminal 640 may be connected to the fourth measuring terminal 524 in a one-to-one relationship.

Through this configuration, when the second surface of the housing 400 is coupled to the secondary battery 1, the second charge/discharge positive electrode terminal 610 may contact the positive electrode lead 310 of the secondary battery 1, and the second charge/discharge negative electrode terminal 620 may contact the negative electrode lead 320 of the secondary battery 1. Additionally, the first measuring terminal 630 may contact the first measuring lead 330 of the secondary battery 1, and the second measuring terminal 640 may contact the second measuring lead 340 of the secondary battery 1.

In this case, the fourth charge/discharge positive electrode terminal 521 may be electrically connected to the positive electrode lead 310 through the second charge/discharge positive electrode terminal 610, and the fourth charge/discharge negative electrode terminal 522 may be electrically connected to the negative electrode lead 320 through the second charge/discharge negative electrode terminal 620. Additionally, the third measuring terminal 523 may be electrically connected to the first measuring lead 330 through the first measuring terminal 630, and the fourth measuring terminal 524 may be electrically connected to the second measuring lead 340 through the second measuring terminal 640. In this instance, the same voltage as the first measuring plate 130 and the second measuring plate 140 may be respectively applied to the third measuring terminal 523 and the fourth measuring terminal 524.

An apparatus for estimating the state of the secondary battery 1, to which the terminal case 2 according to the present disclosure is applied, may measure a potential difference between the third measuring terminal 523 and the fourth measuring terminal 524, and estimate the life or degradation of the secondary battery 1 using the potential difference.

Figure 13:
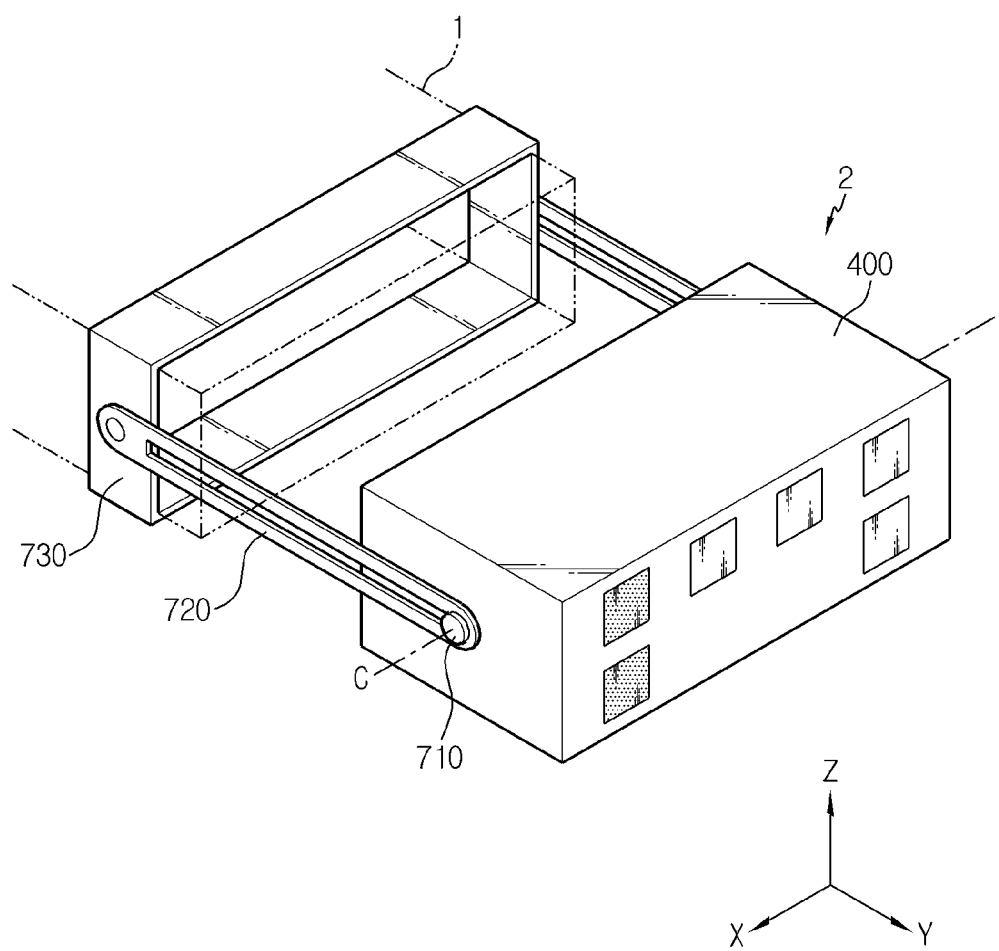
FIG. 13 is a schematic diagram showing a terminal case coupled to a secondary battery according to an embodiment of the present disclosure.

FIG. 13 is a schematic diagram showing the terminal case coupled to the secondary battery according to an embodiment of the present disclosure.

Referring to FIG. 13, the terminal case 2 according to the present disclosure may further include a rotating element 710, a connecting element 720 and a coupling element 730.

The terminal case 2 according to the present disclosure may be coupled to the secondary battery 1. Particularly, the terminal case 2 according to the present disclosure may be coupled to the secondary battery 1 using the rotating element 710, the connecting element 720 and the coupling element 730.

The housing 400 according to an embodiment of the present disclosure may rotate around the rotation axis. Specifically, the housing 400 may rotate such that the first surface or the second surface faces the secondary battery 1. When the first surface of the housing 400 faces the secondary battery 1, the housing 400 may rotate around the rotation axis such that the second surface faces the secondary battery 1. For example, the rotation axis of the housing 400 may include a straight line axis that passes through the center of two parallel surfaces which are perpendicular to both the first surface and second surface of the outer surfaces of the housing 400. Referring to FIG. 13, the rotation axis of the housing 400 is a center axis C, and the housing 400 may rotate around the center axis C such that the first surface or the second surface faces the secondary battery 1.

The rotating element 710 may be coupled to at least two regions of the housing 400. Particularly, the rotating element 710 may be coupled to each of two surfaces of the housing 400. For example, the rotating element 710 may be coupled to the location where the rotation axis of the housing 400 passes through, in each of any two surfaces except the first surface and the second surface of the outer surfaces of the housing 400.

For example, the rotating element 710 has a turning plate and a turning screw to rotate the housing 400 in the up-down direction. Additionally, when the housing 400 rotates, the rotating element 710 may be coupled to the location where the rotation axis of the housing 400 passes through. For example, when the turning screw is coupled to the housing 400, the housing 400 may rotate around the turning screw as the rotation axis. That is, as shown in FIG. 13, the housing 400 may rotate around the center axis C passing through the rotating element 710 as the rotation axis.

The connecting element 720 may connect the coupling element 730 coupled to the secondary battery 1 to the rotating element 710 provided in the housing 400. Particularly, the connecting element 720 may extend from the rotating element 710. More specifically, the connecting element 720 may extend from the rotating element 710 to connect the coupling element 730 coupled to the secondary battery 1 to the rotating element 710 provided in the housing 400.

The coupling element 730 may be mechanically coupled to at least part of the secondary battery 1. That is, the coupling element 730 may be coupled to the secondary battery 1 around the outer surfaces of the secondary battery 1. For example, as shown in FIG. 13, the coupling element 730 may be formed in the shape of a strip and may contact at least part of the secondary battery 1.

Through this configuration, the terminal case 2 according to the present disclosure may rotate around the center axis C as the rotation axis. Moreover, the terminal case 2 according to the present disclosure has the plurality of terminals separately in each case of charging or discharging the secondary battery 1 and estimating the state of the secondary battery 1, and as the terminal case 2 having the plurality of terminals rotates, the state of the secondary battery 1 may be estimated in a simple manner.

Figure 14:
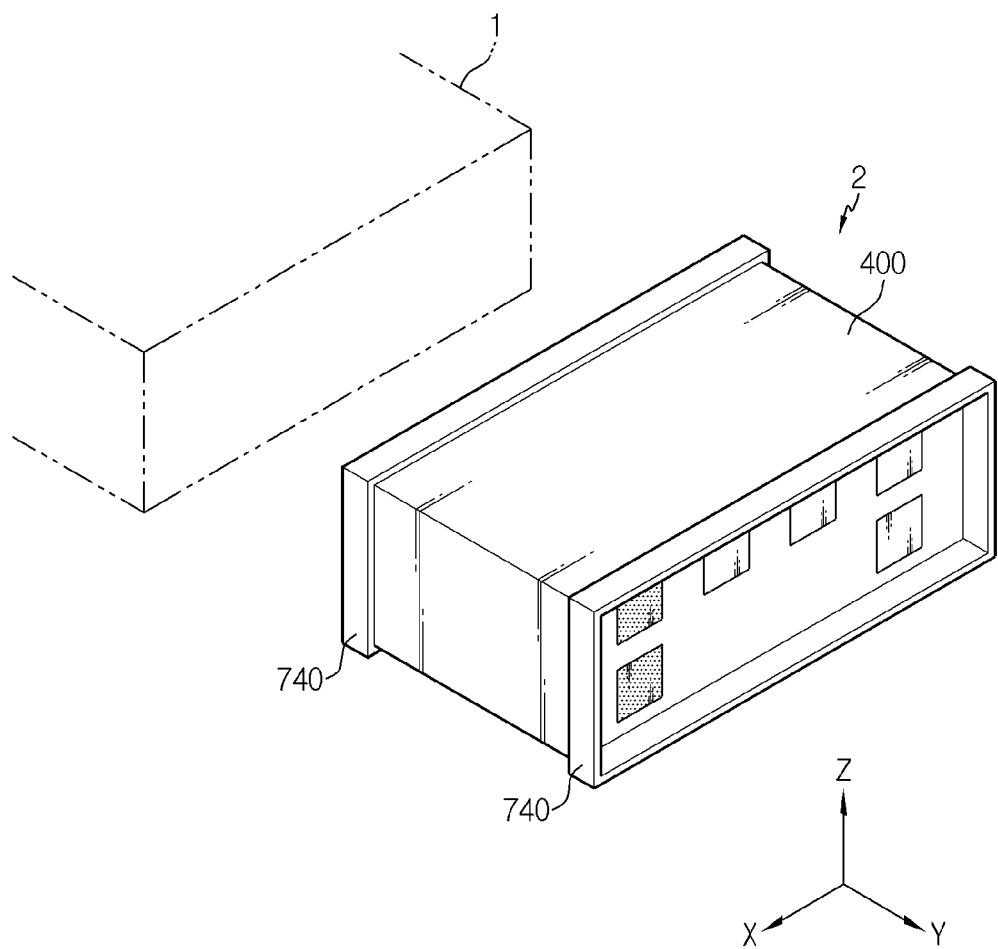
FIG. 14 is a schematic diagram showing a terminal case coupled to a secondary battery according to another embodiment of the present disclosure.

FIG. 14 is a schematic diagram showing the terminal case coupled to the secondary battery 1 according to another embodiment of the present disclosure.

Referring to FIG. 14, the terminal case 2 according to the present disclosure may further include a detaching element 740.

The detaching element 740 may be coupled to each of the first surface and the second surface of the housing 400. Particularly, the detaching element 740 may be formed in the shape of a rectangular strip with protrusion surrounding the secondary battery 1. For example, as shown in FIG. 14, the detaching element 740 may be implemented as a rectangular strip extending out of the housing 400.

Additionally, when the housing 400 is coupled to the secondary battery 1, the detaching element 740 may be fixed to the secondary battery 1. Specifically, when the housing 400 is coupled to the secondary battery 1, the detaching element 740 may be fixed in contact with the outer surface of the secondary battery 1. Particularly, the detaching element 740 may have an internal space surrounding one side of the secondary battery 1. For example, as shown in FIG. 14, when the housing 400 is coupled to the secondary battery 1, the detaching element 740 may be fixed to the secondary battery 1 such that the detaching element 740 surrounds the secondary battery 1.

The terminal case 2 according to the present disclosure may be easily detached from the secondary battery 1. Particularly, the user may selectively easily detach the first surface or the second surface of the housing 400 from the secondary battery 1.

The terminal case 2 according to the present disclosure may be provided in a battery pack itself. That is, the battery pack according to the present disclosure may include the terminal case 2 according to the present disclosure as described above. Here, the battery pack may include a plurality of secondary batteries, the terminal case, electrical components (BMS, relay, fuse, etc.) and a case.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

What is claimed is:

1. A terminal case for connection to a positive electrode lead, a negative electrode lead, a first measuring lead, and a second measuring lead of a secondary battery, the terminal case comprising:
a housing configured to be selectively coupled to the secondary battery in each of a first orientation and a second orientation, wherein a first surface of the housing faces the secondary battery in the first orientation, and wherein a second surface of the housing faces the secondary battery in the second orientation, the second surface being different from the first surface;
a plurality of normal mode terminals disposed on the first surface of the housing, the plurality of normal mode terminals being arranged so as to contact each of the positive electrode lead, the negative electrode lead, the first measuring lead, and the second measuring lead when the housing is coupled to the secondary battery in the first orientation; and
a plurality of measurement mode terminals disposed on the second surface of the housing, the plurality of measurement mode terminals being arranged so as to contact each of the positive electrode lead, the negative electrode lead, the first measuring lead, and the second measuring lead when the housing is coupled to the secondary battery in the second orientation.

2. The terminal case according to claim 1, wherein the plurality of normal mode terminals is disposed on the first surface at symmetrical positions with respect to the plurality of measurement mode terminals disposed on the second surface.

3. The terminal case according to claim 2, wherein the plurality of normal mode terminals is disposed at positions corresponding to positions of the plurality of measurement mode terminals when the housing is rotated around a rotation axis, the rotation axis including a straight line passing through a center of two surfaces of the housing that are parallel to one another and perpendicular to both the first surface and the second surface of the housing.

4. The terminal case according to claim 1, further comprising:
a detaching element coupled to the housing and surrounding both of the first surface and the second surface, the detaching element surrounding outer surfaces of the secondary battery so as to fixedly couple the housing to the secondary battery.

5. The terminal case according to claim 1, further comprising:
a rotating element which is coupled to a location intersected by a rotation axis of the housing, the rotation axis passing through each of any two surfaces of the housing except for the first surface and the second surface.

6. The terminal case according to claim 1, further comprising:
a connecting element extending from the rotating element to connect the rotating element to a coupling element coupled to the secondary battery.

7. The terminal case according to claim 1, wherein the plurality of normal mode terminals includes a first charge/discharge positive electrode terminal and a first charge/discharge negative electrode, and
wherein the housing is configured to be coupled to the secondary battery with the first surface facing the secondary battery, such that the first charge/discharge positive electrode contacts the first measuring lead, the second measuring lead, and the positive electrode lead, and such that the first charge/discharge negative electrode terminal contacts the negative electrode lead.

8. The terminal case according to claim 1, wherein the plurality of measurement mode terminals includes a second charge/discharge positive electrode terminal, a second charge/discharge negative electrode terminal, a first measuring terminal and a second measuring terminal,
wherein the housing is configured to be coupled to the secondary battery with the second surface facing the secondary battery, such that the second charge/discharge positive electrode terminal contacts the positive electrode lead, the second charge/discharge negative electrode terminal contacts the negative electrode lead, the first measuring terminal contacts the first measuring lead, and the second measuring terminal contacts the second measuring lead.

9. A battery pack comprising the terminal case according to claim 1.

10. The terminal case according to claim 5, wherein the rotation axis includes a straight line passing through a center of two surfaces of the housing that are parallel to one another and perpendicular to both the first surface and the second surface of the housing.

* * * * *